United States Patent
van Veldhoven et al.

(10) Patent No.: US 9,154,149 B2
(45) Date of Patent: Oct. 6, 2015

(54) A/D CONVERTER INPUT STAGE PROVIDING HIGH LINEARITY AND GAIN MATCHING BETWEEN MULTIPLE CHANNELS

(71) Applicant: NXP B.V., Eindhoven (NL)

(72) Inventors: Robert Hendrikus Margaretha van Veldhoven, Eindhoven (NL); Fabio Sebastiano, Rotterdam (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/553,721

(22) Filed: Nov. 25, 2014

(65) Prior Publication Data
US 2015/0171882 A1 Jun. 18, 2015

(30) Foreign Application Priority Data

Dec. 18, 2013 (EP) .................................. 13197951

(51) Int. Cl.
*H03M 1/12* (2006.01)
*H03M 3/00* (2006.01)

(52) U.S. Cl.
CPC ................. *H03M 1/12* (2013.01); *H03M 3/35* (2013.01); *H03M 3/424* (2013.01)

(58) Field of Classification Search
CPC ......... H03M 3/424; H03M 3/43; H03M 3/34; H03M 1/00; H03M 3/30
USPC ......................................... 341/155, 156, 143
See application file for complete search history.

(56) References Cited

U.S. PATENT DOCUMENTS

| | | | |
|---|---|---|---|
| 6,975,682 B2 * | 12/2005 | Cosand .......................... | 375/247 |
| 2009/0224954 A1 * | 9/2009 | Balachandran ............... | 341/158 |
| 2012/0262317 A1 * | 10/2012 | Motz et al. .................... | 341/110 |
| 2013/0021184 A1 * | 1/2013 | Ashburn et al. ............... | 341/143 |

FOREIGN PATENT DOCUMENTS

EP 2 421 156 A2 2/2012

OTHER PUBLICATIONS

Extended European Search Report for EP Patent Appln. No. 13197951.0 (Apr. 2, 2014).

* cited by examiner

*Primary Examiner* — Jean B Jeanglaude

(57) ABSTRACT

An input stage for an A/D converter includes a transconductance element adapted to receive, at a first input of the transconductance element, an analog input signal that is to be converted to a digital signal by the A/D converter, a feedback path for providing an analog feedback signal to a second input of the transconductance element, the analog feedback signal being based on a digital output signal of the A/D converter, and an integrator for integrating an output current of the transconductance element, wherein the integrating element is adapted to generate an integrator output signal representative of the integrated output current. The input stage may be included in an A/D converter. A plurality of such A/D converters may be included in a system.

9 Claims, 3 Drawing Sheets

A/D CONVERTER INPUT STAGE PROVIDING HIGH LINEARITY AND GAIN MATCHING BETWEEN MULTIPLE CHANNELS

CROSS-REFERENCE TO RELATED APPLICATIONS

This application claims the priority under 35 U.S.C. §119 of European patent application no. 13197951.0, filed on Dec. 18, 2013, the contents of which are incorporated by reference herein.

FIELD

The present invention relates to the field of A/D converters, in particular to input stages for such converters.

BACKGROUND

In A/D converters (analog to digital converters), the input stage frequently is the most critical part of the converter in terms of noise and linearity. To increase linearity, degeneration of the input transistor pair is often used, but this at the same time increases noise. Another solution is to use an input stage which has feedback to input of the amplifier (like an inverting amplifier), but needs a resistive input, and therefore the input impedance of the A/D converter will be finite, which is not always desirable, in particular when the A/D converter needs to interface with a sensor. Furthermore, such feedback increases power consumption.

Furthermore, in sensor applications it is often required to have signal processing paths that provide adequate gain matching between the different channels. For instance, the output signals of a magnetic angular sensor are respectively proportional to the sine and cosine of the angle to be measured, the ratio of which can be processed by applying the arctangent function to give the angle of a magnetic field. Amplitude differences in the sine and cosine signals caused by mismatch in the independent signal processing paths give rise to angular errors. Therefore, gain matching between the signal processing paths is essential to achieve good performance.

FIG. 1 shows a schematic diagram of a sigma delta A/D converter 100, which achieves high resolution by oversampling noise shaping. More specifically, the converter 100 comprises an adder 104, a filter 106, a quantizer 108 and a feedback D/A converter 114. In operation, an analog input signal 102 is fed as one input to adder 104. The output of the adder 104 is fed to the filter 106, which shapes the quantization noise introduced by the following quantizer 108 running at high speed and providing digital output signal 110. The digital output signal 110 is also supplied as a digital feedback signal 112 to the feedback D/A converter 114 which forwards a resulting analog feedback signal 116 a second input of adder 104 in order to allow the filter 106 to take any error (i.e. difference between analog input signal 102 and analog feedback signal 116) into account. The filter 106 may be an integrator stage. The output of the converter 110 is converted into the analog domain by DA converter 114. The output of the DA converter 114 is compared with the input signal 102 and the error is fed back into the loop. Critical part of the converter 100 is the input stage, which determines the error of the digital representation of the analog input signal. An error made by this input stage itself therefore directly transforms into an error in the digital representation of the input signal which is unwanted. It is noted that SAR (successive approximation) AD converters have a similar issue. Prior art implementations use transconductance (gm) stages that independently convert the input signal and the DA converter signal.

FIG. 2 shows an example of a known input stage 200 for a differential A/D converter. The input stage 200 comprises a first transconductance element 206, a second transconductance element 210, an integrating capacitor 208 and a resistor ladder 216 (forming the feedback D/A converter) capable of providing an output signal value between +Vref and −Vref. The differential analog input signals are supplied to the inputs 202 and 204 of the first transconductance element 206 which generates a first current corresponding to the difference between the two input signals. Similarly, the second transconductance element 210 receives the analog feedback signals from the D/A converter 216 at its inputs 212 and 214 and generates a second current (opposing the first current) corresponding to the difference between the two analog feedback signals. The resulting current, i.e. the sum of the first current and the second current, is integrated on the capacitor 208 and the resulting voltage $V_{out}$ across the capacitor 208 is provided for additional filtering (in case of a loop filter of higher order) or further processing in the quantizing stage of the converter, e.g. the quantizer 108 shown in FIG. 1. In other words, the output current of the first and second transconductance elements 206 and 210 are subtracted in the current domain, and integrated on the capacitor 208. Referring again to FIG. 1, the capacitor 208 may form the entire or a first part of the filter 108. A disadvantage of this implementation is that both transconductance elements have to convert the full swing signals (either the input signal or the DA converter output signal), which will require a highly linear stage to avoid distortion. Normally this linearity is obtained by degeneration of the transconductance stages, but obviously this increases noise (due to the added resistance), and therefore, power needs to be increased in order to achieve the desired noise floor.

There may thus be a need for an input stage for an A/D converter which is capable of providing high linearity and low noise at a lower power consumption, and which is capable of providing gain matching between multiple channels in a simple and reliable manner.

SUMMARY

This need may be met by the subject matter according to the independent claims. Advantageous embodiments of the present invention are set forth in the dependent claims.

According to a first aspect, there is provided an input stage for an A/D converter, the input stage comprising (a) a transconductance element adapted to receive, at a first input of the transconductance element, an analog input signal that is to be converted to a digital signal by the A/D converter, (b) a feedback path for providing an analog feedback signal to a second input of the transconductance element, the analog feedback signal being based on a digital output signal of the A/D converter, and (c) an integrator for integrating an output current of the transconductance element, wherein the integrating element is adapted to generate an integrator output signal representative of the integrated output current.

This aspect is based on the idea that by supplying the analog input signal and the analog feedback signal to the respective inputs of the same transconductance element, the swing of the input signal to the transconductance element (i.e. the difference between the signals input to the transconductance element) is significantly reduced. Therefore, the linearity requirement for the transconductance element is correspondingly reduced and the addition of noisy and power consuming additional resistors is not necessary.

In the present context, the term "transconductance element" may particularly denote a circuit element that generates an output current that is directly dependent on a voltage difference across the first and second input of the transconductance element, i.e. i=gm*v, where gm is a constant factor (the transconductance) specific for the element.

Accordingly, the output current of the transconductance element is representative of the difference between the signals input to the transconductance elements. In other words, the integrated output current represents an integrated difference between the analog input signal to the AD converter and the analog feedback signal provided by the feedback path. Thus the integrator output signal, which is representative of the integrated output current, is a measure for the conversion error of the AD converter.

Assuming that the conversion error of the AD converter is relatively small, it can be realized that the difference between the signals input to the transconductance element is correspondingly small. Thus, the input stage according to this aspect is capable of functioning very well even without a highly linear transconductance element.

According to an embodiment, the input stage further comprises (a) a further transconductance element adapted to receive, at a first input of the further transconductance element, a further analog input signal, and (b) a further feedback path for providing a further analog feedback signal to a second input of the further transconductance element, the further analog feedback signal being based on the digital output signal of the A/D converter, wherein (c) the integrator is adapted to integrate a sum of the output current of the transconductance element and the output current of the further transconductance element, and wherein the integrator output signal is representative of the integrated sum of output currents.

In this embodiment, the input stage comprises a further transconductance element working in a similar manner as the transconductance element described above to generate a current based on a difference between the further analog input signal and the further analog feedback signal. The current generated by the further transconductance element is integrated by the integrator together with the current generated by the transconductance element. Thereby, the integrator output signal is representative of the integrated sum of output currents.

The transconductance (gm) of the further transconductance element may be equal to or different from the transconductance of the transconductance element.

According to a further embodiment, the analog input signal and the further analog input signal are analog input signals for a differential A/D converter.

In the present context, the term "differential A/D converter" is an A/D converter capable of generating a digital representation of a difference between two analog input signals.

It is noted that the further analog input signal and the further analog input signal have the same polarity, i.e. they are in phase. Similarly, the analog input signal has the same polarity (i.e. phase) as the analog feedback signal. However, the analog input signal has the opposite polarity as the further analog input signal.

According to a further embodiment, the first input of the transconductance element and the first input of the further transconductance element have opposite polarity.

Accordingly, also the second input of the transconductance element and the second input of the further transconductance element have opposite polarity.

Thereby, a positive conversion error for the analog input signal will add a positive value to the integrated sum of output currents, while a positive conversion error for the further analog input signal will add a negative contribution to the integrated sum of output currents.

According to a further embodiment, the input stage further comprises a chopper arranged between the output of the transconductance element and the integrator, the chopper being operable to reverse a polarity of the output of the transconductance element.

In the present context, the term "chopper" may in particular denote a switching element capable of connection a first input terminal and a second input terminal with a first output terminal and a second output terminal in two ways, depending on a control signal provided to the chopper: For one value of the control signal, the chopper connects the first input terminal with the first output terminal and the second input terminal with the second output terminal, and for a second value of the control signal, the chopper connects the first input terminal with the second output terminal and the second input terminal with the first output terminal.

By operating the chopper to reverse the polarity of the output current from the transconductance element, the input stage may change from a differential mode of operation to a common-mode of operation.

Alternatively, the chopper may be arranged between the output of the further transconductance element and the integrator.

According to a further embodiment, the integrator comprises a capacitor, and the integrator output signal is a voltage across the capacitor.

It should be noted that although the above aspect and embodiments have been described with reference to an A/D converter, the described input stage could also be used in other circuit structures involving a feedback path, such as e.g. a feedback amplifier. Furthermore, the function of the integrating capacitor, i.e. to provide loop gain, may be achieved by a resistor.

According to a second aspect, there is provided an A/D converter, comprising (a) an input stage according to the first aspect or any of the above embodiments, (b) a quantizing stage adapted to receive the integrator output signal and to generate a digital output signal, and (c) a feedback D/A converter adapted to generate the analog feedback signal by converting the digital output signal to an analog signal and to feed the analog feedback signal to the feedback path.

This aspect is based on substantially the same idea as the first aspect discussed above. In particular, an A/D converter according to the second aspect is cheap and easy to manufacture and nevertheless capable of providing high precision analog to digital conversion with low noise and low power consumption. Furthermore, when implemented with multiple channels, e.g. as a differential A/D converter, gain matching between the channels can be provided in a simple and cost-efficient manner.

In the present context, the term "quantizing" may in particular refer to the process of selecting one of a plurality of discrete (quantized) values as a representative value for a given analog signal level.

In the present context, the term "feedback D/A converter" may in particular refer to a digital to analog converter arranged to convert a digital output signal of the A/D converter back into an analog signal, e.g as it is known in the field of sigma delta A/D converters.

According to an embodiment, the A/D converter further comprises a filtering stage interposed between the input stage and the quantizing stage.

The filtering stage may preferably be adapted to perform additional filtering, such as noise shaping, to the filtering performed by the integrator.

According to a further embodiment, the feedback D/A converter comprises a resistive ladder structure.

The resistive ladder structure is preferably configured to provide a plurality of equally spaced discrete voltage values between a positive reference voltage (+Vref) and a negative reference voltage (−Vref).

According to a further embodiment, the chopper is operable to switch between a differential mode of operation and a common mode of operation by reversing the polarity of the output of the transconductance element.

In the case of a differential A/D converter, this may e.g. be used for calibration at start-up. More specifically, at start-up, the chopper is operated to switch the system to the common-mode of operation and the common-mode difference between an input signal and a corresponding feedback D/A converter output signal is measured. This information may then be used to either adapt the reference voltages for the feedback D/A converter or to adapt the taps of feedback D/A converter (range shifting). This calibration may preferably be improved by adding a dedicated additional set of transconductance elements for measuring the common-mode difference between input signal and feedback D/A converter signal during operation, such that the common-mode may be corrected on the fly.

According to a third aspect, there is provided a system comprising a plurality of A/D converters according to the second aspect or any of the above embodiments thereof, wherein the feedback D/A converters of the plurality of A/D converts share a resistive ladder structure.

The resistive ladder structure is preferably configured to provide a plurality of equally spaced discrete voltage values between a positive reference voltage (+Vref) and a negative reference voltage (−Vref).

By sharing the resistive ladder structure in the sense that the feedback D/A converters all use the same resistive ladder structure, each A/D converter in the system may have the same gain characteristics, such that gain matching can be obtained.

It should be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless otherwise indicated, in addition to any combination of features belonging to one type of subject matter also any combination of features relating to different subject matters, in particular a combination of features of the method type claims and features of the apparatus type claims, is considered to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment to which the invention is, however, not limited.

DETAILED DESCRIPTION

Figure 1:
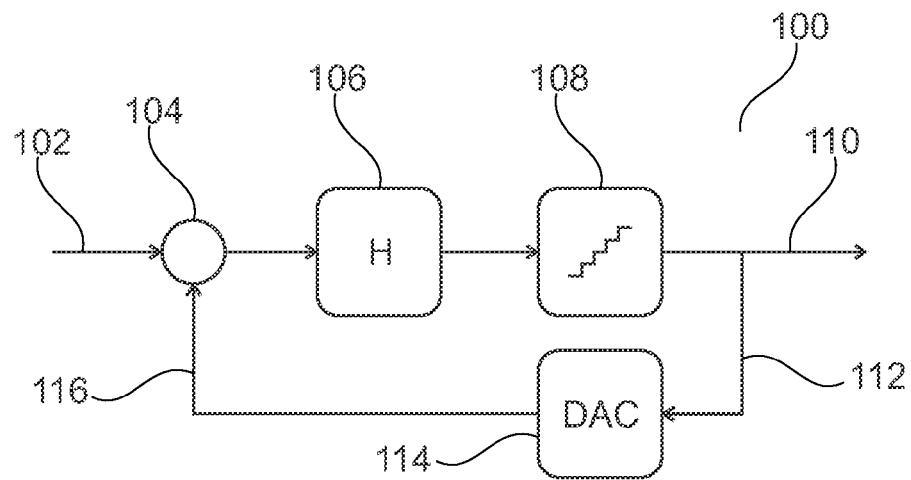
FIG. 1 shows a schematic diagram of a sigma delta A/D converter.

The illustration in the drawing is schematic. It is noted that in different figures, similar or identical elements of the respective embodiments are provided with the same reference signs or with reference signs, which differ only within the first digit.

Figure 2:
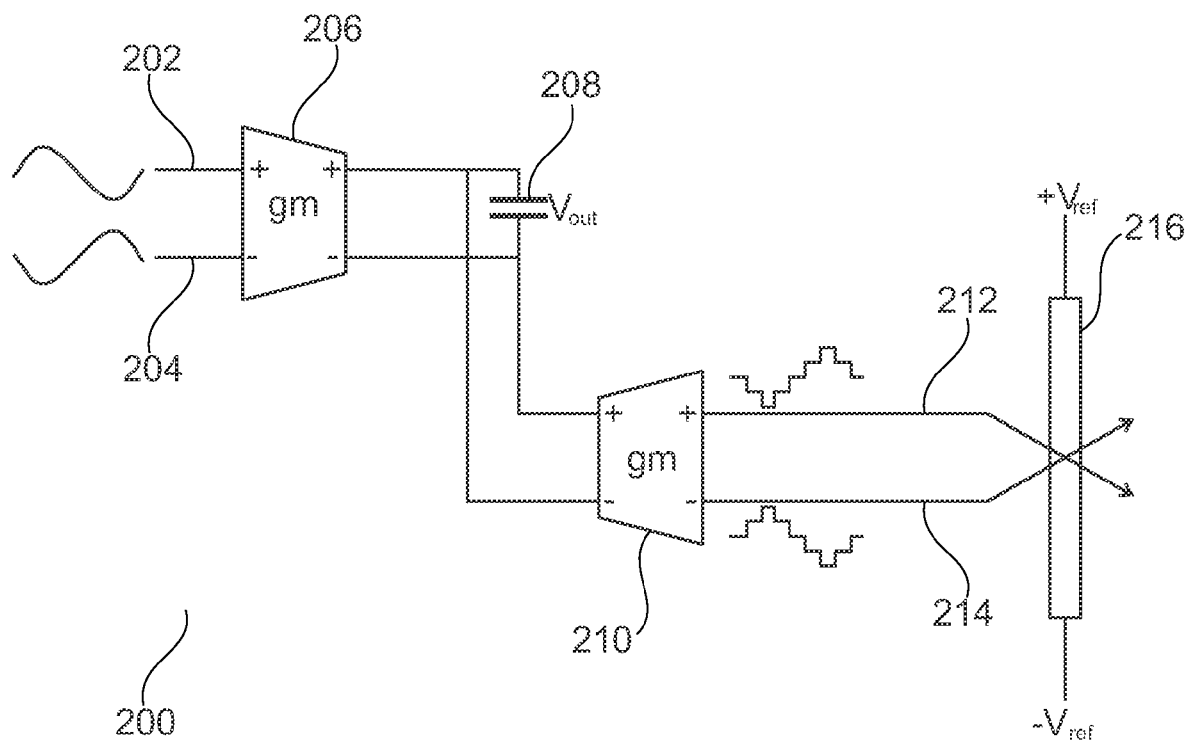
FIG. 2 shows a schematic diagram of a prior art input stage for a differential A/D converter.

With regard to FIGS. 1 and 2, reference is made to the corresponding descriptions thereof given above.

Figure 3:
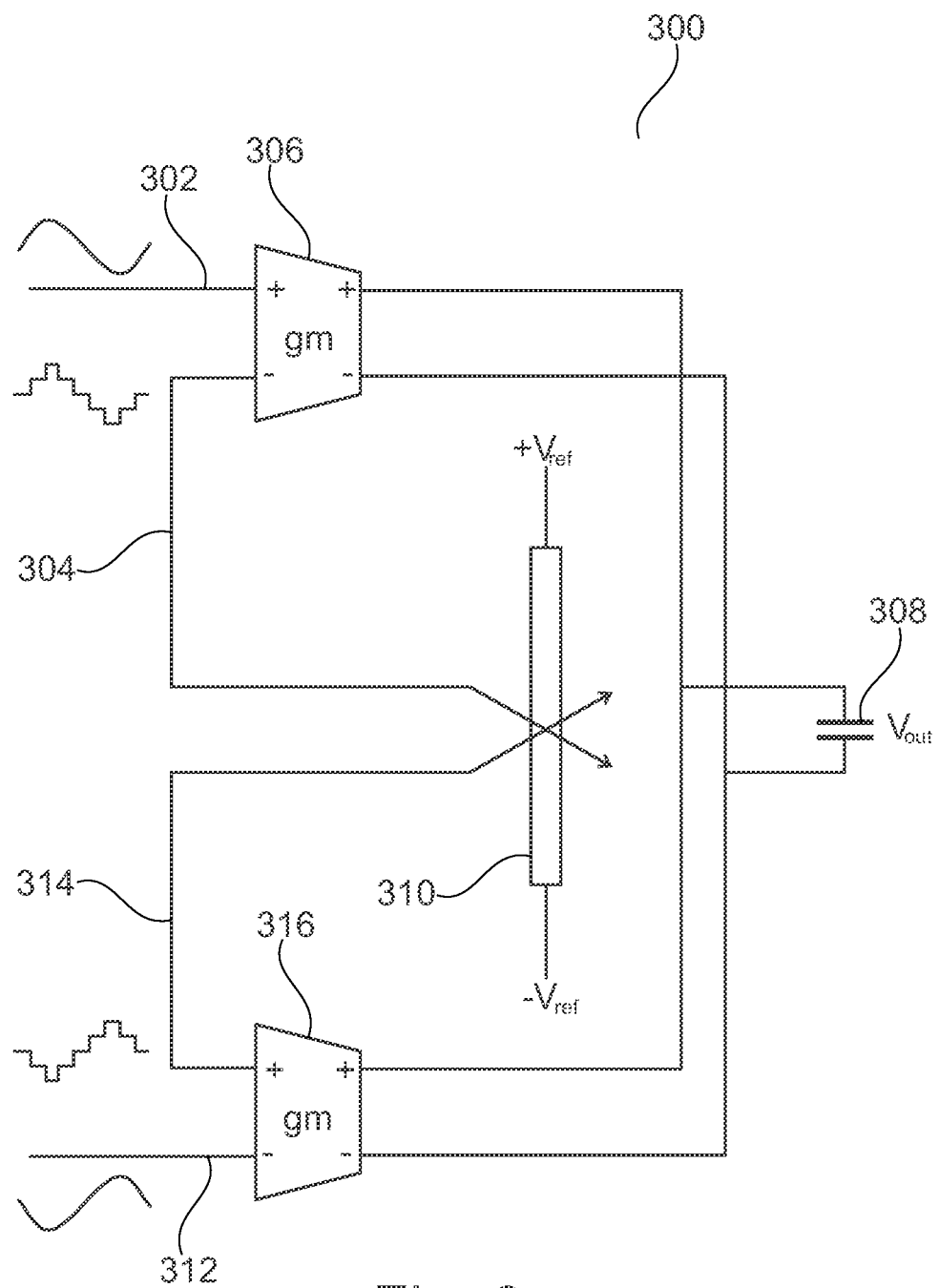
FIG. 3 shows a schematic diagram of an input stage for a differential A/D converter in accordance with an embodiment.

FIG. 3 shows a schematic diagram of an input stage 300 for a differential A/D converter in accordance with an embodiment.

In general, the structure of the input stage 300 differs from the structure 200 of prior art input stage 200 shown in FIG. 2 in that each transconductance element of input stage 300 receives an analog input signal and an analog feedback signal of the same polarity, such that each transconductance element of input stage 300 is exposed to much less signal swing than the transconductance elements of the prior art input stage 200 of FIG. 2.

More specifically, as shown in FIG. 3, the input stage 300 comprises a first transconductance element 306 having a first input 302 and a second input 304, a second transconductance element having a first input 312 and a second input 314, a resistor ladder 310 (constituting a feedback D/A converter), and a capacitor 308 coupled to integrate a sum of the output currents from the first transconductance element 306 and the second transconductance element 316.

The first input 302 of the first transconductance element 306 receives a first analog input signal (e.g. the positive analog input for a differential A/D converter) and the second input 304 of the first transconductance element 306 receives a first analog feedback signal from the resistor ladder 310. Similarly, the first input 312 of the second transconductance element 316 receives a second analog input signal (e.g. the negative analog input for a differential A/D converter) and the second input 314 of the second transconductance element 316 receives a second analog feedback signal from the resistor ladder 310. The positive output terminals of both transconductance elements 306 and 316 are interconnected and connected to one terminal of the integrating capacitor 308. Similarly, the negative output terminals of both transconductance elements 306 and 316 are interconnected and connected to the other terminal of the integrating capacitor 308. Accordingly, the capacitor 308 integrates the sum of currents output by the transconductance elements 306 and 316 (e.g. from the respective positive output terminals) such that the voltage $V_{out}$ across the capacitor 308 is indicative of the integrated sum of output currents.

As shown in FIG. 3 the polarity of the first input 302 of the first transconductance element 306 is the opposite to the polarity of the first input 312 of the second transconductance element 316. Accordingly, a positive difference between the respective voltages at the first and second input terminals 302, 304 of the first transconductance element 306 will result in a positive output current from the positive output terminal (+) of the first transconductance element 306 and thus a positive contribution to the sum integrated by the capacitor 308. Similarly, a negative difference between the respective voltages will provide a negative contribution to the sum integrated by the capacitor 308. On the contrary, a positive difference between the respective voltages at the first and second input terminals 312, 314 of the second transconductance element 316 will result in a negative output current from the positive output terminal (+) of the second transconductance element 316 and thus a negative contribution to the sum integrated by the capacitor 308. Similarly, a negative difference between the respective voltages will provide a positive contribution to the sum integrated by the capacitor 308.

The input stage 300 shown in FIG. 3 has several specific advantages: By feeding the input and feedback signals of the same polarity into the respective transconductance elements 306, 316, subtraction effectively takes place while still in the voltage domain. This greatly reduces the differential swing at the inputs of the transconductance elements 306, 316, reducing the demands on their differential mode linear range, avoiding the need for degeneration, and resulting in a significant power saving.

Another advantage of the input stage 300 is that the noise of the reference D/A converter reference sources is common mode. Also, for a near-midscale D/A converter output, most of the thermal noise of the resistor ladder is common-mode. In single-ended implementations (using only one transconductance element and a single ended input signal), the advantage of the noise of the D/A converter being common-mode is obviously lost.

An additional advantage of the input stage 300 is that if an A/D converter pair is required that requires gain matching between the two signal conversion paths, the reference ladder 310 can be re-used between the channels. Provided that the transconductance elements of each A/D converter match each other, this re-use of the reference ladder 310 gives inherent gain matching between the two channels. Obviously, the reference ladder 310 can be re-used for any number of channels, i.e. for more than two channels. In cases where the transconductance elements of each A/D converter are not matching, gain matching may be obtained repetitively interchanging the transconductance elements during signal conversion.

Figure 4:
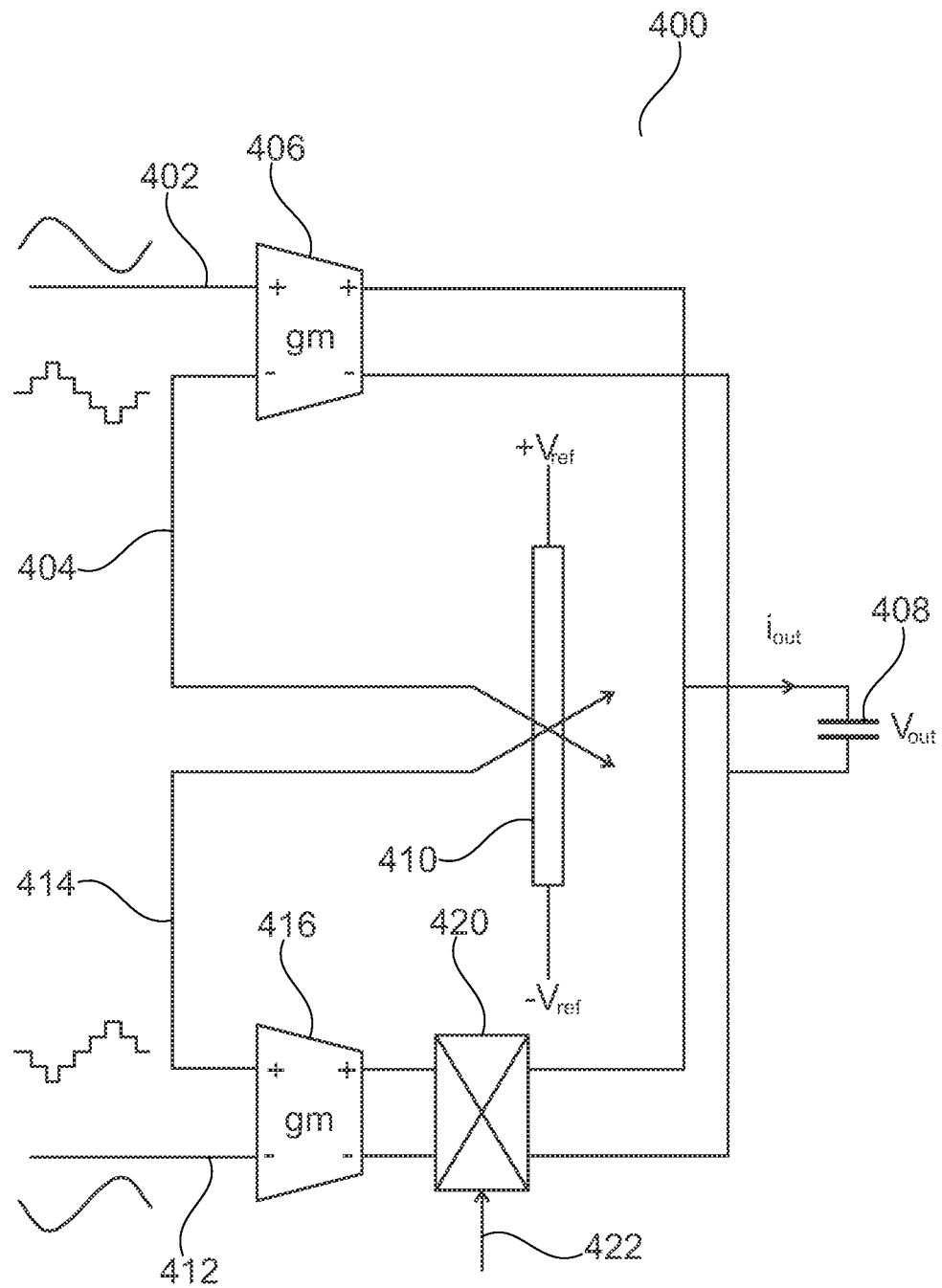
FIG. 4 shows a schematic diagram of an input stage for a differential A/D converter in accordance with a further embodiment.

FIG. 4 shows a schematic diagram of an input stage 400 for a differential A/D converter in accordance with a further embodiment.

As can be seen from FIG. 4, the structure of input stage 400 is, with exception of the additional chopper 420, identical to the structure of input stage 300 shown in FIG. 3 and discussed above. Thus, a detailed discussion of the similar elements will be dispensed with. As already noted, input stage 400 differs from input stage 300 only in that a chopper 420 is provided between the output terminals of the second transconductance element 416 and the integrating capacitor 408. The chopper 420 is capable of, in dependency of a control signal applied to control terminal 422, swap the connections of the output terminals of the second transconductance element 416. That is, when a predetermined control signal is applied to the control terminal 422, the chopper will connect the positive output terminal (+) of the second transconductance element 416 to the negative output terminal (−) of the first transconductance element 406 and the negative output terminal (−) of the second transconductance element 416 to the positive output terminal (+) of the first transconductance element 406. Thereby, the mode of operation is switched from a differential mode (corresponding to the structure shown in FIG. 3) to a common-mode of operation. In the common-mode of operation, a positive voltage difference between the first input terminal 412 and the second input terminal 414 of the second transconductance element 416 will also result in a positive contribution to the sum of currents integrated by the capacitor 408.

More specifically, when operating in differential mode (corresponding to FIG. 3), the sum $i_{out}$ of currents integrated by capacitor 408 is given as:

$$i_{out} = gm((V_g^+ - V_g^-) - (V_{DAC}^+ - V_{DAC}^-))$$

On the other hand, when operating in common-mode, the sum $i_{out}$ of currents integrated by capacitor 408 is given as:

$$i_{out} = gm((V_g^+ + V_f^-) - (V_{DAC}^+ + V_{DAC}^-))$$

In the above equations, Vs denote the (positive and negative) analog input signals and $V_{DAC}$ denote the (positive and negative) analog feedback signals.

The common-mode may be used to calibrate the system at start-up as follows: At start-up, the chopper 420 is set to measure the common-mode difference between the input signal and feedback D/A converter output signal. This information is then used to either adapt the reference voltages Vref, or to adapt the taps of the D/A converter ladder used (range shifting).

The input stages 300 and 400 as well as further embodiments may particularly and beneficially be implemented in sigma delta and SAR analog to digital converters, especially, A/D converters that require high linearity and low power consumption. When used in multi-channel systems, the input stages 300 and 400 enable perfect signal processing path gain matching between the multiple channels. Furthermore, the input stages 300 and 400 may advantageously be used in applications requiring a high input impedance, such as applications involving sensors, e.g. magnetic sensor, optical sensors, acoustic sensors or other sensors.

It is noted that, unless otherwise indicated, the use of terms such as "upper", "lower", "left", and "right" refers solely to the orientation of the corresponding drawing.

It should be noted that the term "comprising" does not exclude other elements or steps and that the use of the articles "a" or "an" does not exclude a plurality. Also elements described in association with different embodiments may be combined. It should also be noted that reference signs in the claims should not be construed as limiting the scope of the claims.

The invention claimed is:

1. An input stage for an A/D converter of differential analog signals, the input stage comprising
    a transconductance element adapted to receive, at a first input of the transconductance element, an analog input signal of the differential analog signals that is to be converted to a digital signal by the A/D converter,
    a feedback path for providing an analog feedback signal to a second input of the transconductance element, the analog feedback signal being based on a digital output signal of the A/D converter,
    an integrator for integrating an output current of the transconductance element, wherein the integrating element is adapted to generate an integrator output signal representative of the integrated output current,
    a further transconductance element adapted to receive, at a first input of the further transconductance element, the other analog input signal of the differential analog signals, and
    a further feedback path for providing a further analog feedback signal to a second input of the further transconductance element, the further analog feedback signal being based on the digital output signal of the A/D converter, wherein the integrator is adapted to integrate a sum of the output current of the transconductance element and the output current of the further transconductance element, and wherein the integrator output signal is representative of the integrated sum of output currents.

2. An A/D converter, comprising
an input stage according to claim 1,
a quantizing stage adapted to receive the integrator output signal and to generate a digital output signal, and
a feedback D/A converter adapted to generate the analog feedback signal by converting the digital output signal to an analog signal and to feed the analog feedback signal to the feedback path.

3. The A/D converter according to claim 2, wherein the feedback D/A converter comprises a resistive ladder structure.

4. A system comprising a plurality of A/D converters according to claim 2, wherein the feedback D/A converters of the plurality of A/D converters share a resistive ladder structure.

5. The input stage according to claim 1, further comprising a chopper arranged between the output of the transconductance element and the integrator, the chopper being operable to reverse a polarity of the output of the transconductance element.

6. The input stage according to claim 1, wherein the integrator comprises a capacitor, wherein the integrator output signal is a voltage across the capacitor, and wherein an output of the transconductance element and an output of the further transconductance element are applied to terminals of the capacitor.

7. The input stage according to claim 1, wherein the first input of the transconductance element and the first input of the further transconductance element have opposite polarity.

8. The A/D converter according to claim 1, further comprising a filtering stage interposed between the input stage and the quantizing stage.

9. An A/D converter of differential analog signals, comprising;
an input stage for the A/D converter, the input stage including,
a transconductance element adapted to receive, at a first input of the transconductance element, an analog input signal of the differential analog signals that is to be converted to a digital signal by the A/D converter,
a feedback path for providing an analog feedback signal to a second input of the transconductance element, the analog feedback signal being based on a digital output signal of the A/D converter, and
an integrator for integrating an output current of the transconductance element, wherein the integrating element is adapted to generate an integrator output signal representative of the integrated output current;
a further transconductance element adapted to receive, at a first input of the further transconductance element, the other analog input signal of the differential analog signals,
a further feedback path for providing a further analog feedback signal to a second input of the further transconductance element, the further analog feedback signal being based on the digital output signal of the A/D converter;
wherein the integrator is adapted to integrate a sum of the output current of the transconductance element and the output current of the further transconductance element, and wherein the integrator output signal is representative of the integrated sum of output currents; and
a chopper arranged between the output of the transconductance element and the integrator, the chopper being operable to reverse a polarity of the output of the transconductance element;
a quantizing stage adapted to receive the integrator output signal and to generate a digital output signal, and
a feedback D/A converter adapted to generate the analog feedback signal by converting the digital output signal to an analog signal and to feed the analog feedback signal to the feedback path,
wherein the chopper is further operable to switch between a differential mode of operation and a common mode of operation by reversing the polarity of the output of the transconductance element.

* * * * *